United States Patent
Deane

(10) Patent No.: US 7,460,634 B2
(45) Date of Patent: Dec. 2, 2008

(54) SHIFT REGISTER CIRCUIT

(75) Inventor: Steven C. Deane, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 90 days.

(21) Appl. No.: 11/572,922

(22) PCT Filed: Jul. 28, 2005

(86) PCT No.: PCT/IB2005/052542

§ 371 (c)(1),
(2), (4) Date: Jan. 30, 2007

(87) PCT Pub. No.: WO2006/013542

PCT Pub. Date: Feb. 9, 2006

(65) Prior Publication Data

US 2007/0248205 A1    Oct. 25, 2007

(30) Foreign Application Priority Data

Jul. 31, 2004    (GB) ................................. 0417132.8

(51) Int. Cl.
*G11C 19/00* (2006.01)

(52) U.S. Cl. ............................... 377/64; 377/70; 377/74

(58) Field of Classification Search ........................ None
See application file for complete search history.

(56) References Cited

U.S. PATENT DOCUMENTS 5,434,899 A * 7/1995 Huq et al. ...................... 377/78
5,701,136 A * 12/1997 Huq et al. ..................... 345/100
5,859,630 A * 1/1999 Huq ............................. 345/100
5,949,398 A * 9/1999 Kim ............................. 345/100
6,052,426 A    4/2000 Maurice
6,064,713 A    5/2000 Lebrun et al.
6,531,996 B1   3/2003 Murade
6,556,646 B1 * 4/2003 Yeo et al. ....................... 377/54
6,876,353 B2 * 4/2005 Morosawa et al. ........... 345/100
2002/0015032 A1   2/2002 Koyama et al.
2002/0149318 A1  10/2002 Jeon et al.
2003/0090452 A1   5/2003 Uchino et al.
2003/0090481 A1   5/2003 Kimura
2007/0127620 A1*  6/2007 Moon et al. ..................... 377/64

FOREIGN PATENT DOCUMENTS

WO    WO0245256 A1    6/2002

* cited by examiner

Primary Examiner—Tuan T Lam

(57) ABSTRACT

Each stage of a shift register circuit has a first input ($R_{n-1}$) connected to the output of the preceding stage, a drive transistor ($T_{drive}$) for coupling a first clocked power line voltage ($P_n$) to the output ($R_n$) of the stage, a compensation capacitor ($C_1$) for compensating for the effects of a parasitic capacitance of the drive transistor, a first bootstrap capacitor ($C_2$) connected between the gate of the drive transistor and the output ($R_n$) of the stage; and an input transistor ($T_{in1}$) for charging the first bootstrap capacitor ($C_2$) and controlled by the first input ($R_{n-1}$). Each stage has an input section (10) coupled to the output ($R_{n-2}$) of the stage two stages before the stage having a second bootstrap capacitor ($C_3$) connected between the gate of the input transistor ($T_{in1}$) and the first input ($R_{n-1}$). The use of two bootstrapping capacitors makes the circuit less sensitive to threshold voltage levels or variations, and enables implementation using amorphous silicon technology.

15 Claims, 4 Drawing Sheets

SHIFT REGISTER CIRCUIT

Figure 1:
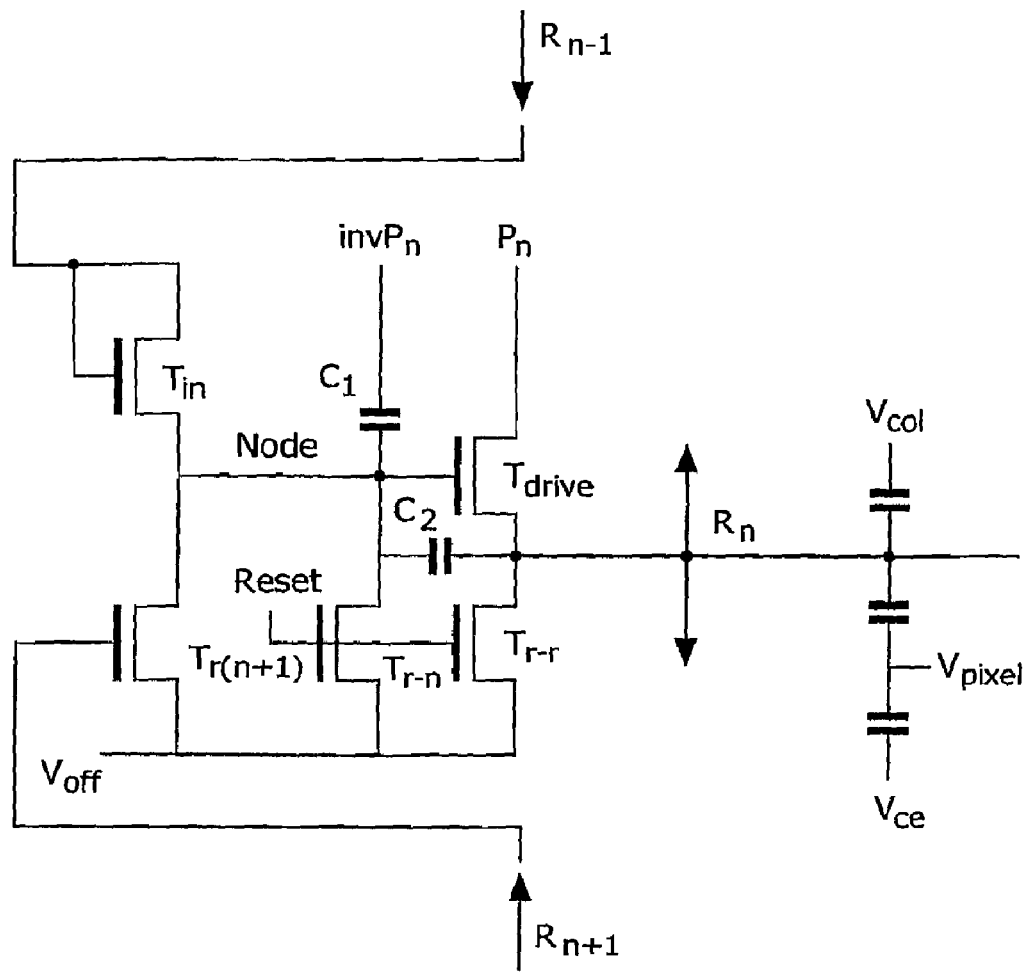

This invention relates to shift register circuits, in particular for providing the row voltages to the display pixels of an active matrix display device.

Active matrix display devices comprise array of pixels arranged in rows and columns, and each comprising at least one thin film drive transistor and a display element, for example a liquid crystal cell. Each row of pixels shares a row conductor which connects to the gates of the thin film transistors of the pixels in the row. Each column of pixels shares a column conductor, to which pixel drive signals are provided. The signal on the row conductor determines whether the transistor is turned on or off, and when the transistor is turned on, by a high voltage pulse on the row conductor, a signal from the column conductor is allowed to pass on to an area of liquid crystal material, thereby altering the light transmission characteristics of the material.

The frame (field) period for active matrix display devices requires a row of pixels to be addressed in a short period of time, and this in turn imposes a requirement on the current driving capabilities of the transistor in order to charge or discharge the liquid crystal material to the desired voltage level. In order to meet these current requirements, the gate voltage supplied to the thin film transistor needs to fluctuate with significant voltage swings. In the case of amorphous silicon drive transistors, this voltage swing may be approximately 30 volts.

The requirement for large voltage swings in the row conductors requires the row driver circuitry to be implemented using high voltage components.

There has been much interest in integrating the components of the row driver circuit onto the same substrate as the substrate of the array of display pixels. One possibility is to use polycrystalline silicon for the pixel transistors, as this technology is more readily suitable for the high voltage circuit elements of the row driver circuitry. The cost advantages of producing the display array using amorphous silicon technology are then lost.

There is therefore an interest in providing driver circuits which can be implemented using amorphous silicon technology. The low mobility of amorphous silicon transistors, as well as the stress-induced change in threshold voltage, present serious difficulties in implementing driver circuits using amorphous silicon technology.

The row driver circuit is conventionally implemented as a shift register circuit, which operates to output a row voltage pulse on each row conductor in turn.

Essentially, each stage of the shift register circuit comprises an output transistor connected between a clocked high power line and the row conductor, and the drive transistor is turned on to couple the row conductor to the clocked high power line to generate a row address pulse. In order to ensure that the voltage on the row conductor reaches the power line voltage (despite the series-connected drive transistor), it is known to take advantage of a bootstrapping effect, using a stray capacitance of the output transistor. This is discussed in U.S. Pat. No. 6,052,426.

A problem with the use of the parasitic capacitances of the drive transistor in this way is that there are other stray effects, and these are also discussed in U.S. Pat. No. 6,052,426. One solution to this is to cancel the effect of the stray capacitance by introducing a first additional capacitor, and to introduce a second additional capacitor dedicated to the bootstrapping operation.

Shift register circuits using additional bootstrapping capacitors in this way are disclosed in U.S. Pat. No. 6,052,426 and in U.S. Pat. No. 6,064,713. In these circuits, the gate of the output transistor is charged by the row pulse of the preceding row, through an input transistor. As a result, the maximum gate voltage which can be applied to the output transistor is dependent on the threshold voltage of the input transistor. Particularly when implementing the shift register circuit using amorphous silicon technology, this can become a limiting factor in the performance of the circuit. This is particularly a problem at low temperatures, as the TFT mobility is then at its lowest, and the threshold voltage is at its highest.

According to the invention, there is provided a shift register circuit comprising a plurality of stages, each stage comprising:
  a first input connected to the output of the preceding stage;
  a drive transistor for coupling a first clocked power line voltage to the output of the stage;
  a compensation capacitor for compensating for the effects of a parasitic capacitance of the drive transistor;
  a first bootstrap capacitor connected between the gate of the drive transistor and the output of the stage; and
  an input transistor for charging the first bootstrap capacitor and controlled by the first input,
  wherein each stage further comprises an input section coupled to the output of the stage two stages before the stage, and wherein the input section comprises a second bootstrap capacitor connected between the gate of the input transistor and the first input.

This circuit arrangement uses two bootstrapping capacitors. One is to ensure the full power supply line voltage can be coupled to the output, and the other is for ensuring that the full row voltage from the preceding stage is coupled through the input transistor to the drive transistor during the gate charging step. The circuit has two precharge cycles of operation—a first cycle when the input transistor gate is precharged, and a second cycle when the drive transistor gate is precharged. This makes the circuit less sensitive to threshold voltage levels or variations, and enables implementation using amorphous silicon technology.

Each stage preferably further comprises a second input connected to the output of the next stage, connected to the gate of a reset transistor which is connected between the gate of the drive transistor and a low power line. The circuit thus has two precharge cycles, one output cycle, and a reset cycle.

The compensation capacitor of each stage is preferably connected between the gate of the drive transistor and a second clocked power line voltage which is clocked complementarily with the first power line voltage. This operates to cancel the effects of parasitic capacitances of the drive transistor.

The input section preferably comprises circuit elements for storing a transistor threshold voltage on the second bootstrap capacitor.

For example, the input section may further comprise:
  a second input transistor which supplies the output of the stage two stages before the stage to the gate of the first input transistor; and
  a decay transistor connected in parallel with the second bootstrap capacitor for decaying the voltage on the second bootstrap capacitor until the threshold voltage of the decay transistor is reached.

The decay transistor preferably has its gate connected to the gate of the first input transistor, so, that they are subject to the same voltage stress, and may also have the same dimensions as the first input transistor. The decay transistor is thus used as a model of the input transistor, and the decay transistor threshold voltage is used to represent the input transistor threshold voltage.

The input section may further comprises a reset transistor having its gate connected to the output of the stage, for discharging the second bootstrap capacitor.

The shift register circuit of the invention is particularly suitable for use in the row driver circuit of an active matrix display device, for example an active matrix liquid crystal display device.

The invention also provides method of generating multiple stage shift register circuit outputs, comprising, for each stage of the shift register circuit:
  using the output of the stage two stages before the stage to charge the gate of an input transistor, and storing the gate-source voltage on a second bootstrap capacitor;
  discharging the second bootstrap capacitor until a threshold voltage is stored on the second bootstrap capacitor;
  using the output of the stage one stage before the stage to charge the gate of a drive transistor through the input transistor and to charge a first bootstrap capacitor storing the gate-source voltage of the drive transistor; and
  coupling a first clocked power supply line voltage to the output of the stage through the drive transistor.

This provides the two-stage precharge operation explained above.

Again, the first bootstrap capacitor can be reset using the output of the next stage and the second bootstrap capacitor can be reset using the output of the stage.

Figure 2:
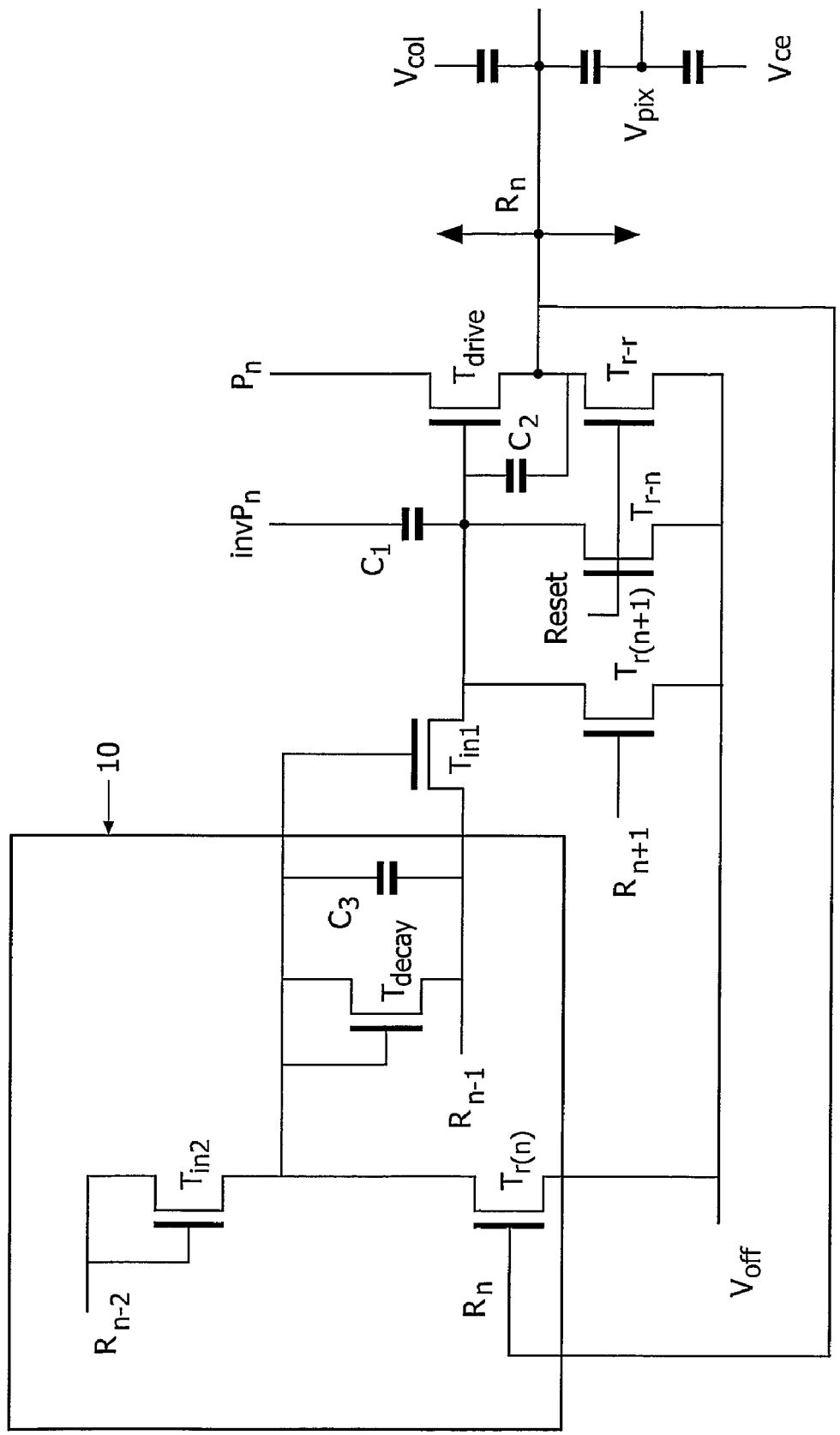
Figure 3:
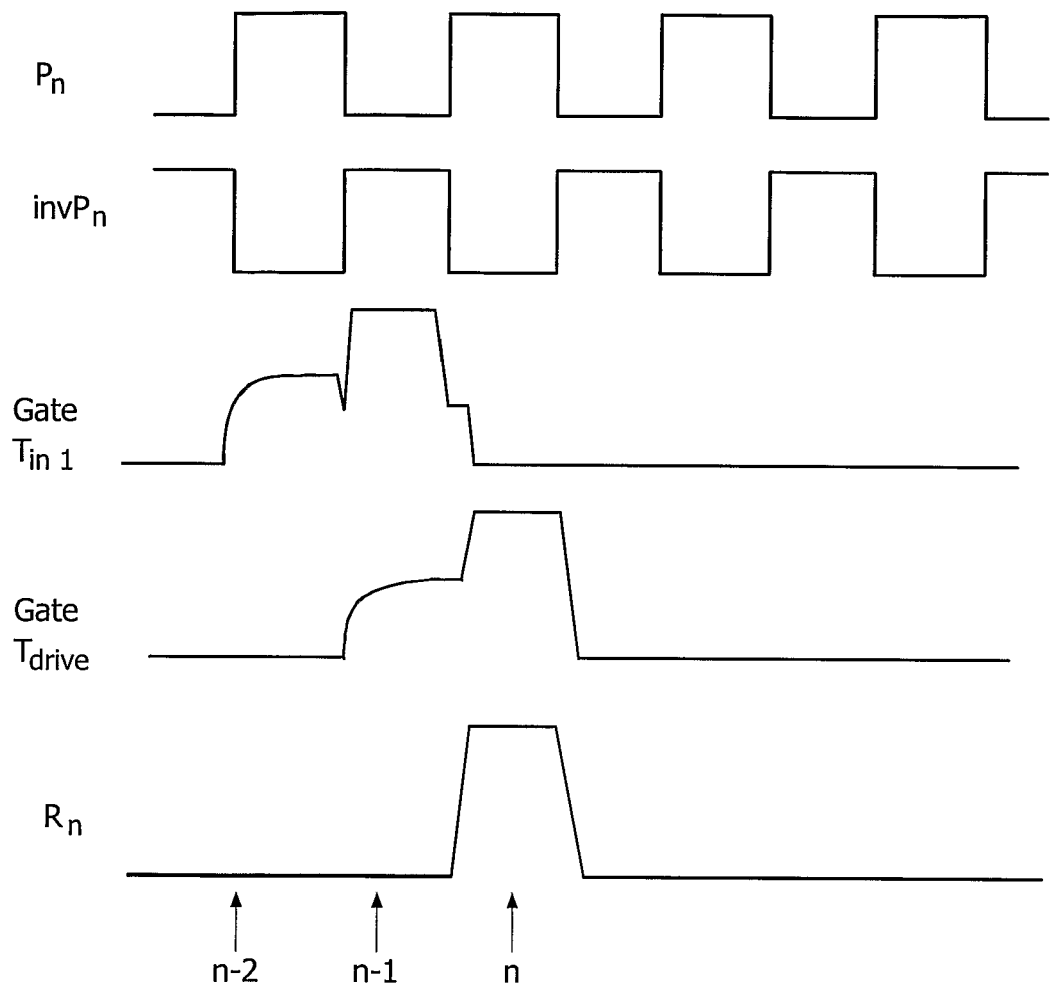
Figure 4:
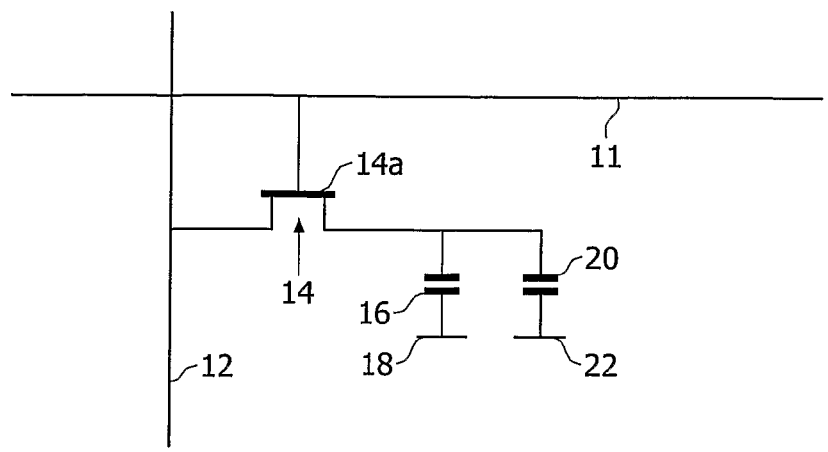
Figure 5:
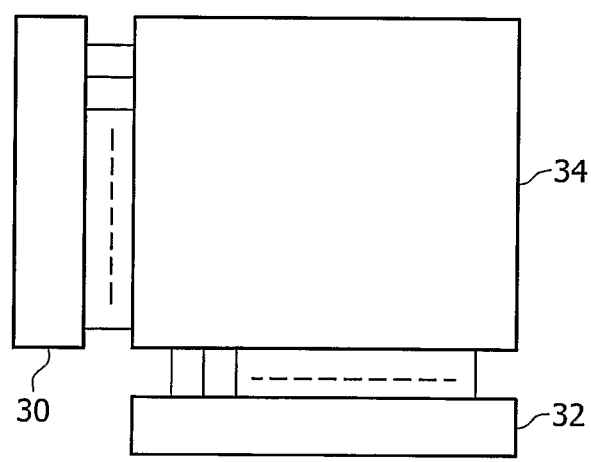

An example of the invention will now be described in detail with reference to the accompanying drawings, in which:
  FIG. 1 shows a known shift register circuit;
  FIG. 2 shows a shift register circuit of the invention;
  FIG. 3 shows a display device of the invention;
  FIG. 4 shows one example of a known pixel configuration for an active matrix liquid crystal display; and
  FIG. 5 shows a display device including row and column driver circuitry, in which the circuit of the invention can be used.

FIG. 1 shows a known high impedance gate driver circuit suitable for use in amorphous silicon active matrix liquid crystal displays (AMLCDs). The circuit shown is a single stage of a multiple stage shift register, with each stage being used to supply a row voltage pulse to one row of pixels. A similar circuit has been described in U.S. Pat. No. 6,052,426.

The circuit comprises an output drive transistor $T_{drive}$ coupled between a clocked power line $P_n$ and the row conductor $R_n$ which is controlled by the stage. The clocked power line (and the complementary signal $invP_n$) is a two phase signal, and the cycles of the clocked power line determine the timing of the sequential operation of the shift register stages.

The row pulse on the previous row $R_{n-1}$ is used to charge the output transistor gate through a diode-connected input transistor $T_{in}$.

A first capacitor $C_1$ is connected between the output transistor gate and the control line which carries the complementary signal to the clocked power line $P_n$ and the purpose of the capacitor $C_1$ is to offset the effects of internal parasitic capacitances of the output transistor.

An additional bootstrapping capacitor $C_2$ is provided between the gate of the output transistor and the row conductor (i.e. the output of the stage).

The stage is also controlled by the row pulse on the next row $R_{n+1}$, which is used to turn off the stage by pulling down the gate voltage of the output transistor. The row pulse on the next row $R_{n+1}$ is provided to the gate of the output transistor through an input transistor $T_{r(n+1)}$ associated with the next row conductor signal.

The circuit also has two reset transistors $T_{r-n}$ and $T_{r-r}$ which are used when initially powering the circuit.

In operation, the input transistor $T_{in}$ charges the output transistor gate during the previous row pulse. During this previous row pulse, the power line $P_n$ is low and the inverse power line $invP_n$ is high. The output transistor is turned on by this previous row pulse, but as the power line $P_n$ is low, the output of the stage remains low.

During this charging stage, the bootstrapping capacitor $C_2$ is charged to the row voltage pulse (less the threshold voltage of the input transistor $T_{in}$).

During the next clock cycle, the clock signal $P_n$ is high, and this increase in voltage pulls up the output voltage on the row conductor $R_n$ through the output transistor. The effect of the bootstrapping capacitor $C_2$ is to increase the gate voltage to ensure that the full voltage level of the clocked signal $P_n$ is passed to the row conductor $R_n$. The transistor $T_{r(n+1)}$ subsequently resets the output transistor gate voltage node during the next row pulse.

In the idle state, the coupling of the inverse power line $invP_n$ through the first additional capacitor $C_1$ is designed to prevent the output transistor gate from turning on when the output transistor $T_{drive}$ receives a pulse from $P_n$.

The operation of the circuit as described above will be known to those skilled in the art.

As mentioned above, one limitation of the operation of the circuit of FIG. 1 is that the charging of the gate of the output transistor during the timing of the previous row pulse is dependent on the threshold voltage of the input transistor $T_{in}$. For amorphous silicon transistors, this threshold voltage may be significant, and furthermore may vary significantly with temperature and over time.

The invention provides an additional input section which is coupled to the output of the stage two stages before the stage. This input section comprises a second bootstrap capacitor connected between the gate of the input transistor and the first input, and operates to cancel the effects of the threshold voltage of the input transistor in the charging of the drive transistor gate.

FIG. 2 shows one stage of the shift register circuit of the invention.

The circuit includes a precharge circuit 10 which is used to sample a TFT threshold voltage onto a second bootstrap capacitor $C_3$. This is then used to bootstrap the input TFT $T_{in1}$, resulting in good charging of the gate of drive transistor gate voltage regardless of the threshold voltage of the input transistor. The row circuit then resets the charge on $C_3$, so that the input TFT $T_{in1}$ does not drift. The other parts of the circuit of FIG. 2 are the same as in FIG. 1, and a description of these components will not be repeated.

The precharge circuit 10 has an input connected to the output $R_{n-2}$, of the stage two before the stage shown. This output $R_{n-2}$, is coupled through a second input transistor $T_{in2}$ to the gate of the first input transistor $T_{in1}$.

The second bootstrap capacitor $C_3$ is connected between the gate of the first input transistor $T_{in1}$ and the output of the preceding stage $R_{n-1}$.

A decay transistor $T_{decay}$ is connected in parallel with the second bootstrap capacitor $C_3$ and is diode-connected. The gate of the decay transistor is connected to the gate of the first input transistor $T_{in1}$ so that they experience the same voltage stress. The decay transistor preferably also has substantially the same dimensions as the first input transistor $T_{in1}$.

The precharge section 10 has a reset transistor Tr(n) having its gate connected to the output of the stage $R_n$, for discharging the second bootstrap capacitor $C_3$.

In operation, the row pulse for the row $R_{n-2}$ two behind the current row is used to charge the gate of the first input transistor $T_{in1}$ and the second bootstrap capacitor $C_3$ via the second input transistor $T_{in2}$. This charging is limited by the decay of the charge through the decay transistor $T_{decay}$.

When row n−2 goes low, the decay transistor $T_{decay}$ causes the voltage across the second bootstrap capacitor $C_3$ to decay to approximately the TFT threshold voltage. The decay transistor $T_{decay}$ and the first input transistor $T_{in1}$ experience the same gate biases at all times, so even in the event of any threshold voltage drift they will exhibit the same threshold voltage.

When row n−1 pulses high, the gate of the first input transistor $T_{in1}$ is bootstrapped by the second bootstrap capacitor $C_3$, resulting in good charging of the gate of the drive transistor $T_{drive}$.

When row n−1 goes low, the charge is not removed via $T_{in1}$ as it is near threshold. Instead, as soon as row n goes high, the discharge transistor $T_{r(n)}$ discharges the voltage across the second bootstrap capacitor $C_3$, turning the first input transistor $T_{in1}$ completely off.

The circuit operation then proceeds as in the known circuit of FIG. 1.

The reset transistor $T_{r(n)}$ can be placed with its lower side connected to the low voltage line $V_{off}$ (as shown), or it can be connected to the preceding row n−1.

FIG. 3 is used to explain schematically the timing of operation of the circuit. The plots show the clocked power supply lines, the gate voltage on the first input transistor $T_{in1}$, the gate voltage on the drive transistor $T_{drive}$ and the output $R_n$.

During the timing n−2 of the stage two behind, the second bootstrap capacitor $C_3$ is precharged. At the end of this phase, there is a drop in voltage until the capacitor stores the threshold voltage. This decay of the voltage on the second bootstrap capacitor continues during the application of the output pulse n−1 to the input transistor, and by the end of the output pulse for row n−1, the voltage across the second bootstrap capacitor will have decayed to the threshold voltage, so that threshold compensation is effective for the input transistor, and the full row voltage is used to charge the first bootstrap capacitor.

During the stage n−1, the output of the stage n−1 is capacitively added to the voltage on the second bootstrap capacitor to derive the gate voltage which drives the first input transistor $T_{in1}$.

During stage n−1, the first bootstrap capacitor $C_2$ is also charged, as can be seen from the plot for the drive transistor gate.

During stage n, the clocked power supply line voltage $P_n$ is added to the voltage on the first bootstrap capacitor $C_2$ to derive the gate voltage of the drive transistor $T_{drive}$.

The beginning of cycle n is used to discharge the second bootstrap capacitor $C_3$ through the reset transistor $T_{r(n)}$ controlled by $R_n$.

The circuit of the invention is particularly suitable for use in the row driver circuit of an active matrix liquid crystal display.

FIG. 4 shows a conventional pixel configuration for an active matrix liquid crystal display. The display is arranged as an array of pixels in rows and columns. Each row of pixels shares a common row conductor 11, and each column of pixels shares a common column conductor 12. Each pixel comprises a thin film transistor 14 and a liquid crystal cell 16 arranged in series between the column conductor 12 and a common electrode 18. The transistor 14 is switched on and off by the signals provided on the row conductors 11, as described above. Each pixel additionally comprises a storage capacitor 20 which is connected at one end 22 to the next row electrode, to the preceding row electrode, or to a separate capacitor electrode. This capacitor 20 stores a drive voltage so that a signal is maintained across the liquid crystal cell 16 after the transistor 14 has been turned off.

In order to drive the liquid crystal cell 16 to a desired voltage to obtain a required gray level, an appropriate signal is provided on the column conductor 12 in synchronism with the row address pulse on the row conductor 11. This row address pulse turns on the thin film transistor 14, thereby allowing the column conductor 12 to charge the liquid crystal cell 16 to the desired voltage, and also to charge the storage capacitor 20 to the same voltage. At the end of the row address pulse, the transistor 14 is turned off, and the storage capacitor 20 maintains a voltage across the cell 16 when other rows are being addressed. The storage capacitor 20 reduces the effect of liquid crystal leakage and reduces the percentage variation in the pixel capacitance caused by the voltage dependency of the liquid crystal cell capacitance.

The rows are addressed sequentially so that all rows are addressed in one frame period, and refreshed in subsequent frame periods.

As shown in FIG. 5, the row address signals are provided by row driver circuitry 30, and the pixel drive signals are provided by column address circuitry 32, to the array 34 of display pixels. The circuit of the invention is suitable for use in the row driver circuitry, and manufactured using amorphous silicon technology. The circuit elements can then be integrated onto the active matrix display substrate.

The circuit of the invention results in far better operation at low temperatures and a wider process margin. This can then be used to allow smaller components to be used for a given application, resulting in lower power and a smaller circuit design, despite the extra TFTs involved (which are all small).

In the example above, the reset transistor $T_{r(n+1)}$ controlled by the next stage is connected between the gate of the drive transistor and the low power line. It may instead be connected between the gate of the drive transistor and the row output, namely across the first bootstrap capacitor $C_2$. Furthermore, this reset transistor could be connected to the output of a different output stage, for example stage n+2, n+3 etc (up to n+number of clock phases −1).

The reset transistor $T_{r(n)}$ of the input section is shown in the example as connected between the gate of the first input transistor $T_{in1}$ and the low power line $V_{off}$. Instead, it may be connected between the gate of the first input transistor $T_{in1}$ and the preceding row output n−1, namely across the second bootstrap capacitor $C_3$. The gate of this reset transistor could also be connected to the output of a different output stage, for example stage n+1, n+2 etc. The circuit will also function without the reset transistor at all.

It will therefore be apparent that there are numerous variations to the specific circuit described in detail, and many other modifications will be apparent to those skilled in the art.

The invention claimed is:

1. A shift register circuit comprising a plurality of stages, each stage comprising:
    a first input ($R_{n-1}$) connected to the output of the preceding stage;
    a drive transistor ($T_{drive}$) for coupling a first clocked power line voltage ($P_n$) to the output ($R_n$) of the stage;
    a compensation capacitor ($C_1$) for compensating for the effects of a parasitic capacitance of the drive transistor;
    a first bootstrap capacitor ($C_2$) connected between the gate of the drive transistor and the output ($R_n$) of the stage; and
    an input transistor ($T_{in1}$) for charging the first bootstrap capacitor ($C_2$) and controlled by the first input ($R_{n-1}$),
    wherein each stage further comprises an input section (10) coupled to the output ($R_{n-2}$) of the stage two stages before the stage, and wherein the input section comprises a second bootstrap capacitor ($C_3$) connected between the gate of the input transistor ($T_{in1}$) and the first input ($R_{n-1}$).

2. A circuit as claimed in claim 1, wherein each stage further comprises a second input ($R_{n+1}$) connected to the output of the next stage.

3. A circuit as claimed in claim 2, wherein the second input ($R_{n+1}$) is connected to the gate of a reset transistor ($T_{r(n+1)}$) which is connected between the gate of the drive transistor and a low power line ($V_{off}$).

4. A circuit as claimed in claim 1, wherein the compensation capacitor ($C_1$) of each stage is connected between the gate of the drive transistor and a second clocked power line voltage ($invP_n$) which is clocked complementarily with the first power line voltage ($P_n$).

5. A circuit as claimed in claim 1, wherein the input section (10) comprises circuit elements for storing a transistor threshold voltage on the second bootstrap capacitor ($C_3$).

6. A circuit as claimed in claim 1, wherein the input section further comprises:
   a second input transistor ($T_{in2}$) which supplies the output of the stage two stages before the stage to the gate of the first input transistor ($T_{in1}$); and
   a decay transistor ($T_{decay}$) connected in parallel with the second bootstrap capacitor for decaying the voltage on the second bootstrap capacitor until the threshold voltage of the decay transistor is reached.

7. A circuit as claimed in claim 6, wherein the decay transistor ($T_{decay}$) has substantially the same dimensions as the first input transistor ($T_{in1}$).

8. A circuit as claimed in claim 1, wherein the input section further comprises a reset transistor ($T_{r(n)}$) having its gate connected to the output of the stage, for discharging the second bootstrap capacitor ($C_3$).

9. A circuit as claimed in claim 1, implemented using amorphous silicon technology.

10. An active matrix display device, comprising:
    an array of active matrix display pixels;
    row driver circuitry comprising a shift register circuit as claimed in claim 1.

11. An active matrix display device as claimed in claim 10, comprising an active matrix liquid crystal display device.

12. A method of generating multiple stage shift register circuit outputs, comprising, for each stage of the shift register circuit:
    using the output ($R_{n-2}$) of the stage two stages before the stage to charge the gate of an input transistor ($T_{in1}$), and storing the gate-source voltage on a second bootstrap capacitor ($C_3$);
    discharging the second bootstrap capacitor ($C_3$) until a threshold voltage is stored on the second bootstrap capacitor;
    using the output of the stage one stage before the stage to charge the gate of a drive transistor ($T_{drive}$) through the input transistor ($T_{in1}$) and to charge a first bootstrap capacitor ($C_2$) storing the gate-source voltage of the drive transistor; and
    coupling a first clocked power supply line voltage ($P_n$) to the output of the stage through the drive transistor.

13. A method as claimed in claim 12, further comprising coupling a second clocked power supply line voltage ($invP_n$) to the drive transistor gate through a compensation capacitor ($C_1$), the first and second clocked power supply line voltages being clocked complementarily.

14. A method as claimed in claim 12, further comprising resetting the first bootstrap capacitor ($C_2$) using the output ($R_{n+1}$) of the next stage.

15. A method as claimed in claim 12, further comprising resetting the second bootstrap capacitor ($C_3$) using the output ($R_n$) of the stage.

* * * * *